(12) United States Patent
Elison et al.

(10) Patent No.: US 9,326,386 B2
(45) Date of Patent: Apr. 26, 2016

(54) COMPUTER SYSTEM COMPONENT BAY

(71) Applicant: International Business Machines Corporation, Armonk, NY (US)

(72) Inventors: Bret P. Elison, Rochester, MN (US); Phillip V. Mann, Rochester, MN (US); Arden L. Moore, Cedar Park, TX (US); Arvind K. Sinha, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 331 days.

(21) Appl. No.: 13/867,553

(22) Filed: Apr. 22, 2013

(65) Prior Publication Data

US 2014/0312750 A1    Oct. 23, 2014

(51) Int. Cl.
| | |
|---|---|
| H05K 7/20 | (2006.01) |
| H05K 3/32 | (2006.01) |
| G06F 1/20 | (2006.01) |
| G11B 33/12 | (2006.01) |
| G11B 33/14 | (2006.01) |
| G06F 1/18 | (2006.01) |

(52) U.S. Cl.
CPC ........ *H05K 3/32* (2013.01); *G06F 1/187* (2013.01); *G06F 1/20* (2013.01); *G11B 33/128* (2013.01); *G11B 33/1426* (2013.01); *G06F 1/18* (2013.01); *Y10T 29/4913* (2015.01); *Y10T 29/49826* (2015.01)

(58) Field of Classification Search
USPC .......... 361/679.46, 679.47, 679.54, 701, 702, 361/711, 724–727
See application file for complete search history.

(56) References Cited

U.S. PATENT DOCUMENTS

| | | | |
|---|---|---|---|
| 3,759,475 A * | 9/1973 | Brown | 248/277.1 |
| 6,069,792 A | 5/2000 | Nelik | |
| 6,201,705 B1 | 3/2001 | Nygren | |
| 6,373,696 B1 | 4/2002 | Bolognia et al. | |
| 6,927,980 B2 * | 8/2005 | Fukuda et al. | 361/700 |
| 7,212,409 B1 * | 5/2007 | Belady et | 361/721 |
| 7,365,990 B2 | 4/2008 | Raghuram | |
| 7,408,776 B2 | 8/2008 | Campbell et al. | |
| 7,539,020 B2 | 5/2009 | Chow et al. | |
| 7,609,477 B2 | 10/2009 | Atarashi et al. | |
| 8,139,355 B2 | 3/2012 | Motschman et al. | |
| 2007/0070607 A1 | 3/2007 | Goodwin | |
| 2009/0161312 A1 * | 6/2009 | Spearing et al. | 361/679.47 |

* cited by examiner

*Primary Examiner* — Tuan T Dinh
*Assistant Examiner* — Mukund G Patel
(74) *Attorney, Agent, or Firm* — Scott S. Dobson; Robert Williams

(57) ABSTRACT

An apparatus includes a component bay having an operational height and an expanded height. The component bay is moveable between the operational height and the expanded height. A thermal element divides the component bay into one or more compartments, each compartment configured to receive a system component. The component bay at the operational height provides thermal contact between the received system component and the thermal element.

17 Claims, 3 Drawing Sheets

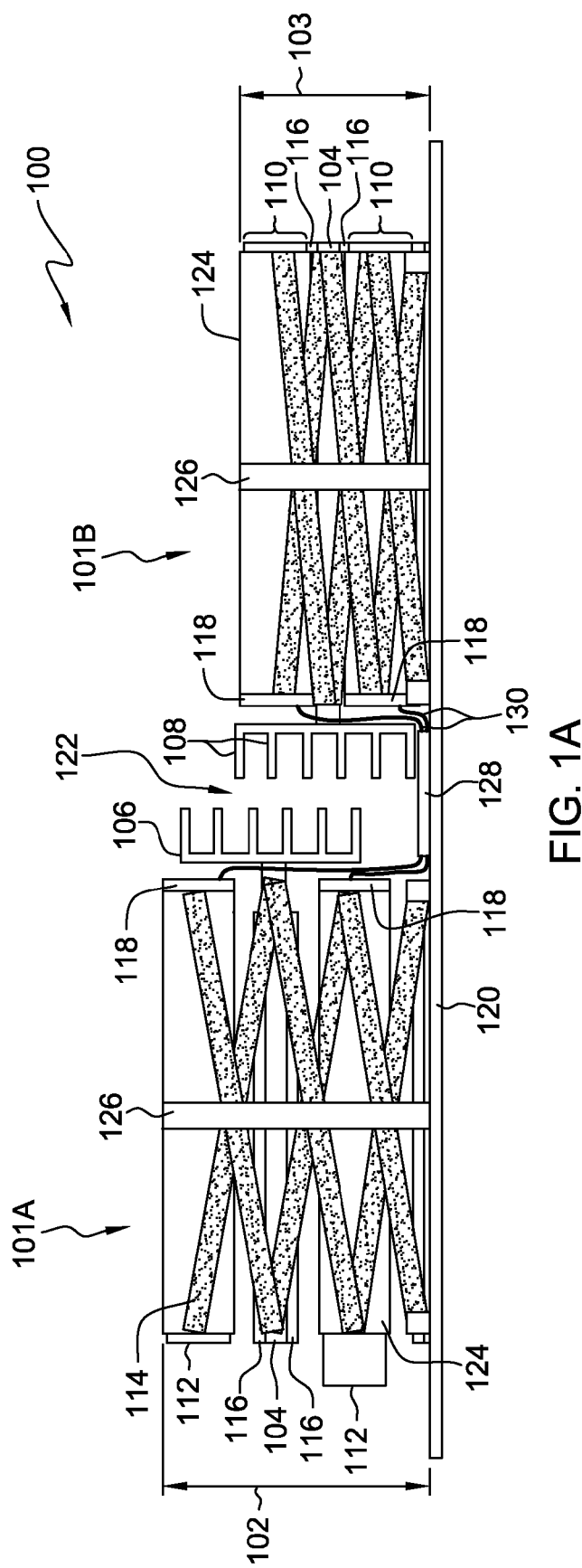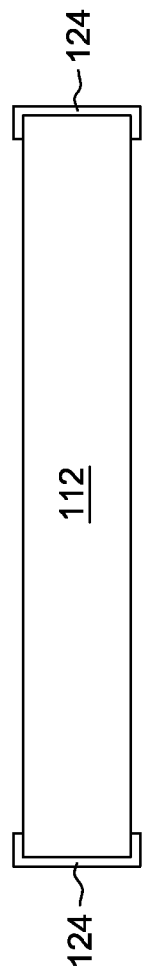
FIG. 1A
FIG. 1B

COMPUTER SYSTEM COMPONENT BAY

FIELD OF THE INVENTION

The present disclosure relates to the mounting and storage of computer system components, such as hard disk drives, and more specifically, to cooling of such components.

BACKGROUND

Hard disk drives are typically mounted at the front of a system, commonly plugging into a stationary vertical backplane. The drives give off heat as they consume electrical energy. Fans are typically used to draw air around the drives to cool them through convective heat transfer.

SUMMARY

Disclosed herein are embodiments of an apparatus for containing computer system components. The apparatus includes a component bay having an operational height and an expanded height. The component bay is moveable between the operational height and the expanded height. A thermal element divides the component bay into one or more compartments, each compartment configured to receive a system component. The component bay at the operational height provides thermal contact between the received system component and the thermal element.

Also disclosed herein are embodiments of a method for containing computer system components. The method includes expanding a component bay to an expanded height, where a thermal element divides the component bay into one or more compartments. The method further includes inserting one or more computer system components into a compartment in the expanded component bay. The method further includes moving the component bay to an operational height such that the one or more computer system components are in thermal contact with a thermal element.

BRIEF DESCRIPTION OF THE SEVERAL VIEWS OF THE DRAWINGS

FIG. 1A depicts a front view of an example of a computer system component storage apparatus.

FIG. 1B depicts a side view of an example configuration of sheet metal guide tracks supporting a computer system component.

DETAILED DESCRIPTION

Figure 2:
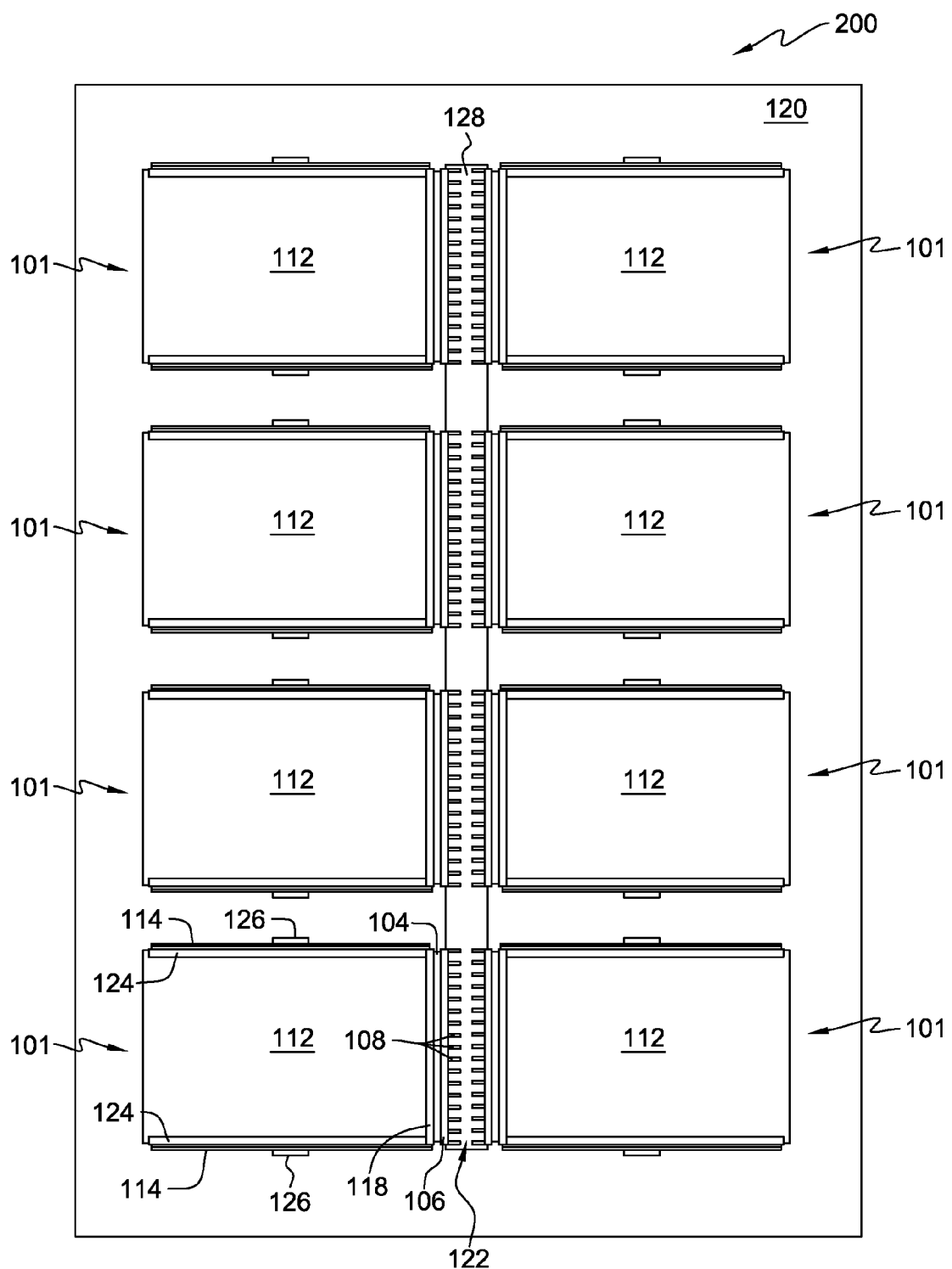
FIG. 2 depicts a top view of an example of a computer system component storage apparatus.

As server functionality and content has grown, so too has the number and capacity of hard disk drives and other components integrated into server designs to satisfy customer demands. These banks of disks are often situated close in parallel at the front of a server system, thereby serving as a source of preheat to downstream components and posing a significant resistance to airflow, especially when combined with a vertical backplane. These conditions have a negative impact on the overall cooling solution and can drive the system to larger fans, higher fan speeds, or more expensive, aggressive thermal management components. These aggressive thermal management components have drawbacks including cost and noise produced. As the number of disks and their power dissipation grows, so too do these thermal challenges.

Embodiments of the present invention use a combination of conduction and convection to cool hard disk drives and other computer system components, wherein heat may be transferred via conduction from a disk drive to a thermal element and heat may be transferred from the thermal element to air flowing through a heat dissipation region on the thermal element. This combination may allow for higher heat dissipation per drive than convection-only cooling. Some embodiments provide a central airflow channel which may provide less resistance to airflow and more efficient cooling compared to drawing air around the drives. This may allow for reduction in the size or number of fans required to cool the drives. Some embodiments may allow for more use of the depth of a system, compared to the typical plugging of disk drives into the front of a system.

Embodiments of the present invention will now be described in detail with reference to the figures.

FIG. 1A illustrates a computer component storage apparatus 100 with two component bays 101 (shown as 101A and 101B) according to an embodiment of the present invention. An alternative computer storage apparatus could have any number of component bays 101, including as few as one. In FIG. 1A, computer component storage apparatus 100 includes component bay 101A at expanded height 102 and component bay 101B at operational height 103. Component bay 101A and component bay 101B are identical in FIG. 1A, but component bay 101B is rotated horizontally 180 degrees from component bay 101A. However, other embodiments may have component bays 101 in a different relationship to each other.

Each component bay 101 may be divided into multiple compartments 110 by one or more thermal elements 104. In the illustrated embodiment, there are two compartments 110 which are divided by thermal element 104. In other embodiments there could be any number of compartments 110, including as few as one, and further there could be any number of thermal elements 104 defining these compartments 110. For example, FIG. 1A illustrates thermal element 104 extending horizontally through the middle of component bay 101 to divide the component bay into two separate compartments 110, with a compartment below thermal element 104 and a compartment on top of thermal element 104. Alternatively, an embodiment could include thermal element 104 extending horizontally through component bay 101 at the top or the bottom to divide the component bay into just one compartment 110. Another embodiment could include more thermal elements 104 extending horizontally through the component bay 101 to create more than two compartments 110 where compartments 110 and thermal elements 104 alternate vertically. Further, an embodiment could include one thermal element 104 consisting of multiple plates, wherein the plates are all connected to each other and each plate extends horizontally through the component bay 101 to create two or more compartments 110 with compartments 110 and plates alternating vertically. Even further, an embodiment could include any of the foregoing configurations wherein the thermal elements 104 run vertically through the component bay such that compartments 110 and thermal elements 104 alternate horizontally across the component bay.

Compartments 110 may be configured to receive a computer system component 112, such as a hard disk drive. When component bay 101A is at expanded height 102, computer system components 112 may be inserted and removed from compartments 110. FIG. 1A illustrates component bay 101A at expanded height 102 with one computer system component 112 partially removed from a compartment 110. When component bay 101B is at operational height 103, received computer system components 112 may be in thermal contact with thermal element 104. Thermal contact does not necessarily mean that there is actual physical contact, although in some embodiments there may be actual physical contact. Thermal contact means that heat is capable of being transferred between received computer system components 112 and thermal element 104. In some embodiments, some of the received computer system components 112 may be placed in thermal contact with more than one thermal element 104. For example, an embodiment may contain two thermal elements 104 which divide the component bay 101 into three compartments 110. The component bay 101B at the operational height 103 may place the computer system component 112 received into the middle compartment 110 in thermal contact with both thermal elements 104, with a thermal element 104 on each opposing side of the computer system component 112. In this embodiment, the other two compartments 110 may be in thermal contact with only one of the thermal elements 104.

Computer system components 112 can be any component of a computer system including a hard disk drive or a dual in-line memory module. FIG. 1A illustrates component bays 101 with compartments 110 configured to receive a hard disk drive in a horizontal position. In other embodiments, the compartments 110 could be configured to receive the hard disk drive in a vertical position or any other orientation.

In the illustrated embodiment, compartments 110 are configured to computer system components 112 using u-shaped sheet metal guide tracks 124. U-shaped sheet metal guide tracks 124 may cover most of the side of computer system components 112, but cover only a small portion of the top and bottom of computer system components 112, as shown in FIG. 1B. This may allow for guide tracks 124 to leave a larger surface area of computer system components 112 available for thermal contact with thermal element 104. FIG. 1B shows a side view of sheet metal guide tracks 124 supporting computer system component 112. Computer system components 112 may slide along sheet metal guide tracks 124. The sheet metal in this embodiment can be any type of sheet metal.

In other embodiments the compartments 110 could be configured into any structure and made of any material capable of supporting computer system components 112 and allowing for thermal contact between computer system components 112 and thermal element 104. Alternative embodiments may include compartments 110 configured to support multiple computer system components 112. For example, an embodiment may include a compartment 110 configured to receive two computer system components 112 side-by-side such that they are both placed in thermal contact with the same side of the same thermal element 104 when the component bay 101B is at the operational height 103.

The component bays 101 may contain any mechanism configured to allow movement between expanded height 102 and operational height 103. In FIG. 1A, scissor structures 114 are located on opposing sides of component bay 101A and component bay 101B to provide movement between expanded height 102 and operational height 103. Scissor structures 114 may be connected to sheet metal guide tracks 124 and thermal element 104. Scissor structures 114 may be identical, as they are in FIG. 1A where component bay 101B is the same as the component bay 101A horizontally rotated 180 degrees. In the illustrated embodiment, scissor structures 114 place installed computer system components 112 in thermal contact with thermal element 104 when component bay 101 is at operational height 103.

Scissor structures 114 in FIG. 1A use manual force applied by a user to move from expanded height 102 to operational height 103, or from operational height 103 to expanded height 102. In alternative embodiments the movement of scissor structures 114 could occur via electronic motor, gear and crank mechanism, or any other method. Although FIG. 1A illustrates scissor structure 114 for movement between the expanded height 102 and the operational height 103, other structures are contemplated.

Thermal element 104 can be any element capable of receiving heat from received system components 112. In FIG. 1A, thermal element 104 is a conduction plate that is part of a typical heat sink which has a heat dissipation region 106. There may be a continuous thermal connection between the thermal element 104 and heat dissipation region 106 such that heat may be transferred from thermal element 104 to heat dissipation region 106. Thermal element 104 and heat dissipation region 106 can be made of copper, aluminum, or any other thermally conductive material. Further, thermal element 104 may contain a phase-change element such as a vapor chamber or a heat pipe to enhance thermal spreading.

Heat dissipation region 106 may have fins 108. In the illustrated embodiment, fins 108 are pin fins arranged in parallel which extend outward from a base plate. The pin fins may be cylindrical in shape, conical in shape, or may be some other shape. Fins 108 may be made of copper, aluminum, or any other thermally conductive material. Heat dissipation region 106 could alternatively have any combination of pin fins, plate fins, or any other structure arranged in parallel, flared, or in any other arrangement. Heat dissipation region 106 could alternatively be a single plate with no fins 108. In alternative embodiments, thermal element 104 could be a cold plate or other element which may not be connected a heat dissipation region 106. These alternative embodiments may or may not provide heat dissipation region 106.

In FIG. 1A, heat dissipation region 106 of component bay 101A faces heat dissipation region 106 of component bay 101B. The alignment of the heat dissipation regions 106 may create airflow channel 122 with heat dissipation regions 106 bounding the airflow channel. Fins 108 may extend out into airflow channel 122. Airflow channel 122 may allow for cooling air to flow with a low flow resistance. The only source of flow resistance in the airflow channel 122 may be fins 108. Alternative embodiments may have heat dissipation regions 106 facing in opposing directions to create two airflow channels 122 with heat dissipation regions 106 bounding only one side of the airflow channels 122.

To increase thermal conductivity, thermal interface material 116 may be associated with thermal element 104 between thermal element 104 and compartments 110. In FIG. 1A, thermal interface material 116 is a thermal pad mounted on opposing sides of thermal element 104. With the component bay 101B at operational height 103, thermal interface material 116 may be compressed between received computer system components 112 and thermal element 104. The compression may minimize contact resistance and allow for more efficient heat transfer between the surfaces of received computer system components 112, thermal interface material 116, and thermal element 104. This is an example of thermal contact where there is no actual physical contact between received system component 112 and thermal element 104. Heat is transferred from received system component 112 to the thermal element 104 via thermal interface material 116. The thermal pad may be a thermally conductive, compliant elastomer or similar material. The thermal pad may be reusable such that it does not need replacing when it is removed from contact with the computer system component. In other embodiments, thermal interface material 116 can be a thermal grease or any other thermally conductive compound or material.

Component bays 101 are optionally supported by a frame module 120 which may be at least partially removed from a frame unit. Component bays 101 may be mounted to frame module 120 or simply rest on frame module 120. Frame module 120 can be a drawer, tray, or any other structure. Frame module 120 and the frame unit may contain any mechanism which allows for the frame module to be at least partially removable from the frame unit including any combination of wheels, guide tracks, or any other structures. The frame unit can be a stand-alone media unit which houses a single frame module 120, or it can house any number of different components and any number of frame modules 120. Frame module 120 may have power and data connectors at one end which can electronically connect computer system components 112 to the rest of a system which may be housed within or connected to the frame unit.

For example, frame module 120 may be a drawer which can slide in and out of a frame unit which houses a fully functional server. The drawer may have power and data connectors at one end which electronically connect received computer system components 112 to the main power supply, processor, memory, and any other elements of the system. Alternatively, the frame unit may house only the single drawer and the drawer connects to support hardware on the frame unit which is cabled to the rest of the system.

In some embodiments component bay 101 may be connected to frame module 120 with a pivot mechanism. The pivot mechanism allows the component bay 101 to be rotated to allow vertical access to the component bay. This rotation may be, for example, about 90 degrees. This may be useful if there are space constraints on that do not allow horizontal access to compartments 110.

In some embodiments, compartments 110 each contain a backplane 118 for electronically connecting received computer system components 112 to provide power and allow communication between components 112 and other system components not shown. Backplanes 118 may be connected by cables 130 to a printed circuit board 128 associated with frame module 120. Printed circuit board 128 may be located in the bottom of the frame module. Cables 130 may facilitate the movement of the component bay 101 between the expanded height 102 and the operational height 103 compared to a rigid structure. In some embodiments, frame module 120 may have power and data connectors at one end which electronically connect computer system components 112 to the rest of the system through the printed circuit board 128.

Component bay 101 may be secured at operational height 103 in a variety of different ways. For example, the weight of received computer system components 112 may bias the component bay to the operational height 103. Additionally, or in the alternative, a retainer 126 may be provided for securing the component bay at the operational height 103. Retainer 126 can be any element capable of securing component bay 101 at the operational height including, for example, a latch or a hook and eye.

FIG. 2 illustrates a top-down view of computer component storage apparatus 200 which has eight component bays 101 mounted on frame module 120, according to an embodiment of the present invention. A frame unit may contain any number of computer storage apparatuses such as computer storage apparatus 200. Component bays 101 may be constructed similar to those illustrated in FIG. 1A, and may include multiple compartments 110 in a variety of configurations. For example, each component bay 101 may include three compartments 110 configured to receive computer system components 112. In such a configuration, computer system components 112 of FIG. 2 may obscure a second and third tier of computer system components 112.

Scissor structures 114 may be located on opposing sides of each component bay 101. Component bays 101 may have heat dissipation regions 106 thermally connected to thermal elements 104 which are mostly obscured from view in FIG. 2 by computer system components 112. Computer system components 112 may be supported by sheet metal guide tracks 124. Heat dissipation regions 106 bound airflow channel 122. Heat dissipation regions 106 may contain fins 108 which extend into airflow channel 122.

In FIG. 2, component bays 101 are arranged in two rows with heat dissipation regions 106 of each row facing each other and bounding airflow channel 122. This arrangement creates a central airflow channel 122 which runs between heat dissipation regions 106 of each row. Airflow channel 122 may allow for more efficient cooling of received system components 112. Further, this configuration may allow for more use of the depth of a frame unit. An alternative embodiment could have component 101 bays in FIG. 2 rotated 180 degrees such that heat dissipation regions 106 of each row face away from each other toward the outer edge of frame module 120. This embodiment could have two airflow channels 122 which are bounded by heat dissipation regions 106 on only one side.

Figure 3:
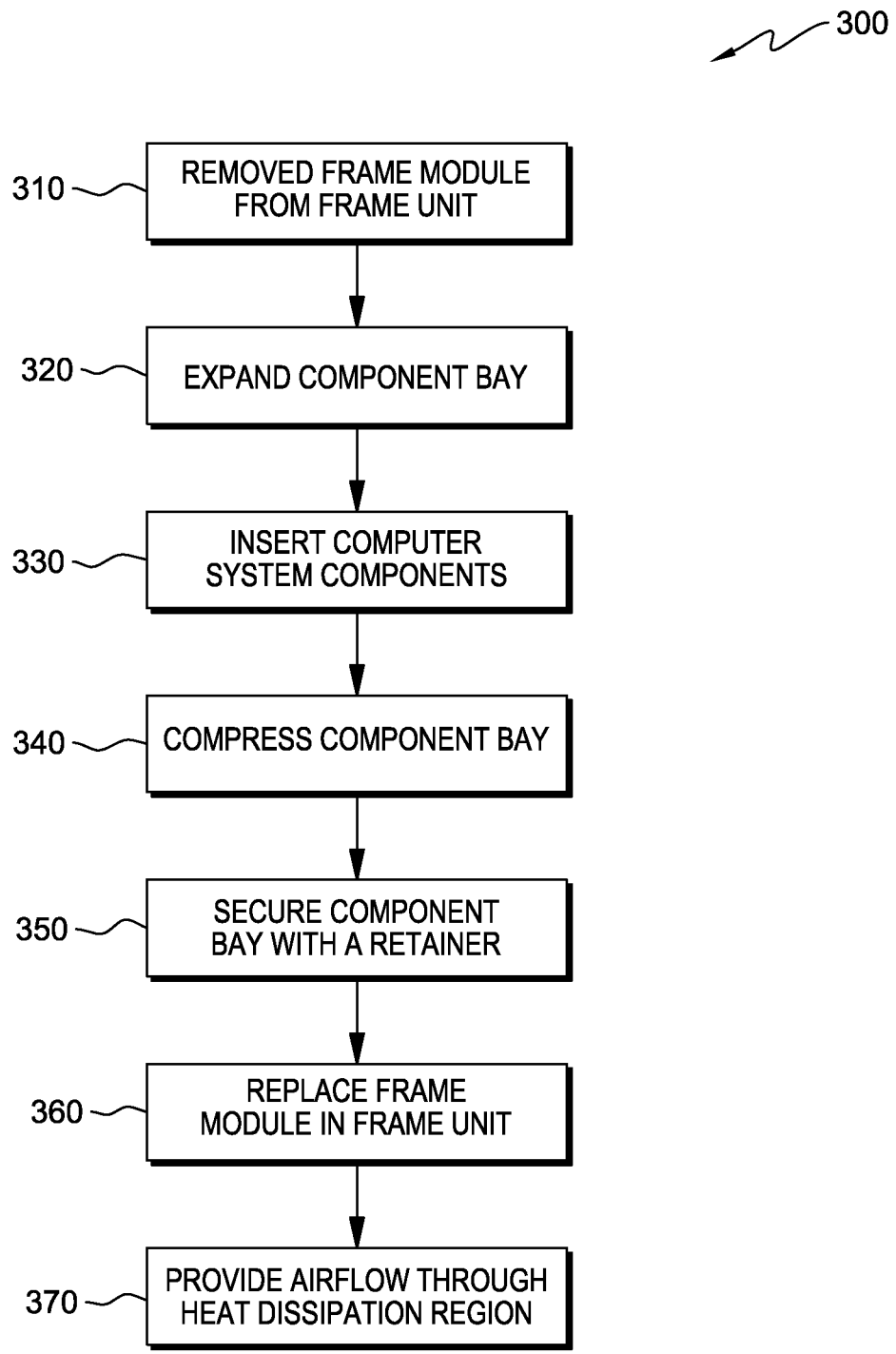
FIG. 3 is a flow diagram for an example method for storing computer system components.

Flow diagram 300 in FIG. 3 is a flow diagram illustrating an example embodiment of a method for containing computer system components. At step 310, a frame module which supports a component bay is at least partially removed from a frame unit. This removal can occur through force applied by a user, through an electronic mechanism, or any other method. At step 320, the component bay is expanded to the expanded height. This expansion can occur through direct application of force by a user on the component bay or through any other mechanical or electronic mechanism. At step 330, a computer system component is inserted into a compartment in the expanded component bay. This step can optionally include electronically connecting the computer system component to a printed circuit board associated with the frame module. This electronic connection could occur by connecting the computer system component to a backplane situated within the compartment wherein the backplane is connected by cable to the printed circuit board.

At step 340, the component bay is moved to the operational height. This movement can occur through direct application of force on the component bay or through any other mechanical or electronic mechanism. The operational height places the received computer system component in thermal contact with the thermal element. At step 350 the component bay is secured at the operational height using a retainer. The retainer can be any mechanism capable of securing the component bay at the operational height including a latch or a hook and eye. At step 360, the frame module is replaced into the frame unit. This replacement can occur through force applied by a user or any other method. At step 370, airflow is provided through the heat dissipation region of the thermal element. Airflow can be provided by a fan or any other method.

Although flow diagram 300 illustrates specific steps performed in a particular order, embodiments of the disclosed method may employ fewer steps, more steps, or similar steps performed in a different order. Furthermore, multiple steps may be combined into a single step, and single steps may be divided into multiple steps.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus for containing computer system components, the apparatus comprising:
   a component bay having an operational height and an expanded height, the component bay moveable between the operational height and the expanded height;
   a thermal element dividing the component bay into two compartments, each of the two compartments configured to receive a system component, wherein the component bay at the operational height provides thermal contact between the received system components and the thermal element;
   wherein the component bay contains scissor structures on opposing sides of the component bay, the scissor structures providing movement of the component bay between the operational height and the expanded height,
   a frame module supporting the component bay; and
   a frame unit configured to support the frame module, wherein the frame module configured to move between a first position and a second position, the first position within the frame unit, the second position at least partially removed from the frame unit.

2. The apparatus of claim 1, wherein the system components are hard disk drives, and wherein each of the one or more compartments has a u-shaped sheet metal guide track configured to receive the hard disk drives in a horizontal position.

3. The apparatus of claim 1, wherein the thermal element is a conduction plate, the apparatus further comprising:
   a heat dissipation region thermally connected to the conduction plate.

4. The apparatus of claim 3, further comprising:
   a thermal interface material associated with two opposing sides of the conduction plate, wherein the component bay at the operational height provides contact between the thermal interface material and received system components.

5. The apparatus of claim 4, wherein the thermal interface material is a thermal pad.

6. The apparatus of claim 5, wherein the thermal pad is compressed between the received system components and the conduction plate when the component bay is at the operational height.

7. The apparatus of claim 3, wherein the heat dissipation region contains fins selected from the group consisting of pin fins and plate fins.

8. The apparatus of claim 1, further comprising:
   a backplane associated with each of the one or more compartments, the backplane configured to electronically connect to the received system component.

9. The apparatus of claim 8, further comprising:
   a printed circuit board associated with the frame module; and
   a cable electronically connecting the backplane to the printed circuit board.

10. The apparatus of claim 1, further comprising:
    a retainer configured to secure the component bay at the operational height.

11. The apparatus of claim 1, wherein the thermal element extends horizontally through the component bay with a first compartment of the two compartments above the thermal element and a second compartment of the two compartments below the thermal element.

12. An apparatus for containing computer system components, the apparatus comprising:
    a frame module;
    a plurality of component bays supported by the frame module, the plurality of component bays having an operational height and an expanded height, the plurality of component bays moveable between the operational height and the expanded height;
    a conduction plate dividing each component bay into two compartments, each of the two compartments configured to receive a system component, wherein the component bay at the operational height provides thermal contact between the received system components and the conduction plate;
    a heat dissipation region thermally connected to each conduction plate;
    wherein each component bay contains scissor structures on opposing sides of the component bay, the scissor structures providing movement of the component bay between the operational height and the expanded height,
    a frame unit supporting the frame module, wherein the frame module is configured to move between a first position and a second position, the first position within the frame unit, the second position at least partially removed from the frame unit.

13. The apparatus of claim 12, wherein the plurality of component bays are arranged in two rows to create a central airflow channel, the heat dissipation regions bounding the central airflow channel.

14. The apparatus of claim 13, further comprising:
    a backplane associated with each compartment, each backplane configured to electronically connect to received system components;
    a printed circuit board associated with the frame module; and
    a cable connecting each backplane to the printed circuit board.

15. The apparatus of claim 13, wherein the received system components are hard disk drives.

16. The apparatus of claim 12, further comprising:
    a thermal interface material associated with two opposing sides of each conduction plate, wherein the operational height provides contact between the thermal interface material and received system components.

17. An apparatus for containing computer system components, the apparatus comprising:
    a first component bay having an operational height and an expanded height;
    a pair of scissor structures on opposing sides of the first component bay, the pair of scissor structures configured to provide movement of the first component bay between the operational height and the expanded height, each of the pair of scissor structures on opposing sides of the first component bay;
    a conduction plate extending horizontally through the first component bay and dividing the first component bay into two compartments;

a u-shaped guide track within each of the two compartments, each of the u-shaped guide tracks configured to receive a hard disk drive;
a thermal pad mounted on each of a top face and bottom face of the conduction plate, wherein the first component bay at the operational height provides thermal contact between the received hard disk drives and the thermal element through contact with the thermal pads compressed between the received hard disk drives and the thermal element, the received hard disk drives on opposing sides of the thermal element;
a backplane associated with each of the two compartments, each backplane configured to electronically connect to received hard disk drives;
a frame module supporting the first component bay and a plurality of other component bays, the first component bay and the plurality of other component bays arranged in two rows to create a central airflow channel, heat dissipation regions from the first component bay and the plurality of other component bays bounding the central airflow channel;
a frame unit configured to support the frame module, wherein the frame module configured to move between a first position and a second position, the first position within the frame unit, the second position at least partially removed from the frame unit;
a printed circuit board associated with the frame module; and
a cable electronically connecting each backplane to the printed circuit board.

* * * * *